(12) United States Patent
Zhou (10) Patent No.: US 10,748,462 B2
(45) Date of Patent: Aug. 18, 2020

(54) HARDWARE CONTROLLER OF NAND DEVICE, CONTROL METHOD AND LIQUID CRYSTAL DISPLAY

(71) Applicant: SHENZHEN CHINA STAR OPTOELECTRONICS TECHNOLOGY CO., LTD., Shenzhen, Guangdong (CN)

(72) Inventor: Xuebing Zhou, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 41 days.

(21) Appl. No.: 16/228,416

(22) Filed: Dec. 20, 2018

(65) Prior Publication Data

US 2019/0371220 A1     Dec. 5, 2019

Related U.S. Application Data (63) Continuation of application No. PCT/CN2018/095807, filed on Jul. 16, 2018.

(30) Foreign Application Priority Data

May 29, 2018 (CN) .......................... 2018 1 0530147

(51) Int. Cl.
*G06F 11/10* (2006.01)
*G06F 12/02* (2006.01)
(Continued)

(52) U.S. Cl.
CPC ......... *G09G 3/006* (2013.01); *G06F 11/1068* (2013.01); *G06F 12/0246* (2013.01);
(Continued)

(58) Field of Classification Search
None
See application file for complete search history.

(56) References Cited

U.S. PATENT DOCUMENTS 5,751,951 A * 5/1998 Osborne ............... G06F 13/128
                                                709/250
5,898,687 A * 4/1999 Harriman ............ H04L 12/5601
                                                370/389

(Continued)

FOREIGN PATENT DOCUMENTS

| CN | 102331911 A | 1/2012 |
| CN | 105302474 A | 2/2016 |
| CN | 107247563 A | 10/2017 |

*Primary Examiner* — Joni Hsu
(74) *Attorney, Agent, or Firm* — Leong C. Lei (57) ABSTRACT

Disclosed is a hardware controller of a Nand device, a control method and a liquid crystal display. The hardware controller includes: a bad block management module, configured to manage bad block information of the Nand device, where the bad block information represents a bad block set in the Nand device; a main control module, configured to receive an operation command of a terminal; wherein the operation command is used to indicate a read/write operation on a target block set of the Nand device and a data transmission mode to perform the read/write operation, and the data transmission mode includes at least one of parallel transmission and serial transmission; and a read/write module, configured to skip a block in the Nand device that exists both in the bad block set and the target block set, and perform the read/write operation on remaining blocks in the target block set.

15 Claims, 7 Drawing Sheets

(51) Int. Cl.
  *G09G 3/00*   (2006.01)
  *G09G 3/36*   (2006.01)
  *G11C 16/04*  (2006.01)
  *G11C 29/52*  (2006.01)
  *G11C 16/14*    (2006.01)
  *G11C 16/26*    (2006.01)
  *G11C 16/10*    (2006.01)

(52) U.S. Cl.
  CPC ........... *G09G 3/36* (2013.01); *G11C 16/0483* (2013.01); *G11C 29/52* (2013.01); *G06F 2212/2022* (2013.01); *G06F 2212/72* (2013.01); *G09G 2330/027* (2013.01); *G09G 2330/12* (2013.01); *G09G 2360/121* (2013.01); *G09G 2370/045* (2013.01); *G11C 16/10* (2013.01); *G11C 16/14* (2013.01); *G11C 16/26* (2013.01)

(56) References Cited

U.S. PATENT DOCUMENTS

| | | | | |
|---|---|---|---|---|
| 2005/0185472 | A1* | 8/2005 | Randell | G06F 12/1441 365/185.33 |
| 2009/0259799 | A1* | 10/2009 | Wong | G06F 12/0207 711/103 |
| 2010/0005226 | A1* | 1/2010 | Maeda | G06F 3/0605 711/103 |
| 2010/0313099 | A1* | 12/2010 | Yamaga | G06F 11/1012 714/755 |
| 2018/0286485 | A1* | 10/2018 | Takizawa | G11C 16/0483 |

\* cited by examiner

HARDWARE CONTROLLER OF NAND DEVICE, CONTROL METHOD AND LIQUID CRYSTAL DISPLAY

CROSS REFERENCE

This application is a continuation application of PCT Patent Application No. PCT/CN2018/095807, filed on Jul. 16, 2018, which claims priority benefit of Chinese Patent Application No. 201810530147.X, filed on May 29, 2018, which is herein incorporated by reference in its entirety.

FIELD OF THE INVENTION

The present invention relates to a field of electronic circuit, and more particularly to a hardware controller of a Nand device, a control method and a liquid crystal display.

BACKGROUND OF THE INVENTION

With the continuous development of electronic technology, large-volume, high-density data often needs to be stored and managed in practical applications. For instance in a Timer Control Register (TCON) application of a liquid crystal display, configuration parameters, operation data, compensation data and the like need to be stored, and as the resolution of the panel increases, various compensation data are refined. The amount of data stored is getting bigger and bigger. Therefore, various parameter requirements for a memory for storing data are also becoming higher and higher. In the prior art, the Nand (not and) device is widely used as a non-volatile storage device with good performance (for example, Nand Flash memory) because of its large capacity, low cost and long life. Nand devices are usually composed of blocks. During the production and use of Nand devices, bad blocks may generate due to hardware physical defects or abnormal shutdown, power failure, termination of service and process abnormalities. A bad block is a block in a Nand device that does not support read/write operations due to some failure. Its characteristic is that an operation error occurs when page program or block erase is performed to this block.

In order to reduce the impact of bad blocks on the use of the Nand device, the prior art solution is to perform bad block management on the Nand device through the processor based on the software program. However, this solution has the defects of occupying large memory and low read/write speed.

SUMMARY OF THE INVENTION

The embodiment of the present invention provides a hardware controller of a Nand device, a control method and a liquid crystal display. The hardware is used to perform bad block management on Nand devices, which is beneficial to solve the defects mentioned in the background, such as large memory and low read/write speed, and supports Nand devices of different data access modes to make the read/write operations of the Nand device more suitable.

First, the present invention provides a hardware controller of a Nand device, comprising:

a bad block management module, configured to manage bad block information of the Nand device, where the bad block information represents a bad block set in .nm the Nand device;

a main control module, configured to receive an operation command of a terminal; wherein the operation command is used to indicate a read/write operation on a target block set of the Nand device and a data transmission mode used to perform the read/write operation, and the data transmission mode includes at least one of parallel transmission and serial transmission; and a read/write module, configured to skip a block in the Nand device that exists in the bad block set and the target block set at the same time, and perform the read/write operation on remaining blocks in the target block set.

In some possible implementations, the write operation includes at least one of an erase operation and a program operation; the bad block management module is further configured to add a block corresponding to the write operation as a bad block to the bad block set when data is not successfully written into the block in the write operation.

In some possible implementations, the hardware controller further comprises an error check module, wherein the error check module is configured to perform error check and correction on data corresponding to the read operation during the read operation.

In some possible implementations, the hardware controller further comprises a speed test module, wherein the speed test module is configured to test a maximum access speed of the Nand device; and the read/write module is specifically configured to perform the read/write operation on the remaining blocks in the target block set according to the maximum access speed.

In some possible implementations, the hardware controller further comprises a power down protection module, wherein the power down protection module is configured to save the bad block information of the Nand device, the data transmission mode corresponding to the Nand device and the maximum access speed corresponding to the Nand device to a memory.

Second, the present invention provides a control method, comprising: obtaining bad block information of a Nand device, where the bad block information represents a bad block set in the Nand device;

receiving an operation command of a terminal; wherein the operation command is used to indicate a read/write operation on a target block set of the Nand device and a data transmission mode used to perform the read/write operation, and the data transmission mode includes at least one of parallel transmission and serial transmission; and skipping a block in the Nand device that exists in the bad block set and the target block set at the same time, and perform the read/write operation on remaining blocks in the target block set.

In some possible implementations, the control method further comprises: adding a block corresponding to the write operation as a bad block to the bad block set when data is not successfully written into the block in the write operation; and wherein the write operation includes at least one of an erase operation and a program operation.

In some possible implementations, the control method further comprises: performing error check and correction on data corresponding to the read operation during the read operation.

In some possible implementations, the control method further comprises: testing a maximum access speed of the Nand device; and performing the read/write operation on the remaining blocks in the target block set according to the maximum access speed.

In some possible implementations, the control method further comprises: saving the bad block information of the Nand device, the data transmission mode corresponding to the Nand device and the maximum access speed corresponding to the Nand device to a memory.

Third, the present invention provides a liquid crystal display comprising the hardware controller described first as above.

By implementing the embodiment of the present invention, the read/write module performs the read/write operation on the blocks in the target library set in the Nand device except the bad block set based on the data transmission mode determined by the main control module, combined with the bad block information in the bad block management module. Thus, the embodiment of the present invention is applicable not only to the Nand device of different data transmission modes, but also can perform fast read/write operations on the basis of the bad block management of the Nand device without occupying the large running memory of the terminal, thereby improving the applicability of the Nand device.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. 12. The liquid crystal display according to claim 11, wherein the write operation includes at least one of an erase operation and a program operation; the bad block management module is further configured to add a block corresponding to the write operation as a bad block to the bad block set when data is not successfully written into the block in the write operation.

It is to be noted that the embodiments of the present invention are described in detail below, and the examples of the embodiments are illustrated in the drawings, wherein the same or similar reference numerals are used to refer to the same or similar elements or elements having the same or similar functions. The embodiments described below with reference to the drawings are intended to be illustrative for the invention and are not to be construed as limitation.

The following disclosure provides many different embodiments or illustrations for implementing different structures of the present invention. In order to simplify the disclosure of the present invention, the components and arrangements of the specific illustrations are described below. Certainly, they are merely illustrations and are not intended to limit the invention. Furthermore, the present invention may repeat reference numerals and/or letters in different illustrations. This repetition is for the purpose of simplification and clarity, and does not indicate the relationship between the various embodiments and/or arrangements discussed.

In order to facilitate the understanding of the technical solution of the present invention, the functional blocks involved in the embodiments of the present invention are first described. Please refer to FIG. 1. In the embodiment of the present invention, the Nand device comprises a plurality of blocks. In general, the blocks can be used to store/erase data and support read/write operations (such blocks can be referred to as good blocks), as the Nand device in the figure includes a memory array consisting of block_0, block_1 . . . block_i . . . block_n, etc. The basic unit of the block is a page. Correspondingly, the bad block is a block in the Nand device that does not support read/write operations due to failure. The bad blocks can be categorized into inherent bad blocks and used bad blocks. The inherent bad blocks refer to bad blocks that are produced during the production process of the manufacturer the used bad blocks refer to bad blocks generated by block erase or page program errors found during use of the Nand device.

Figure 1:
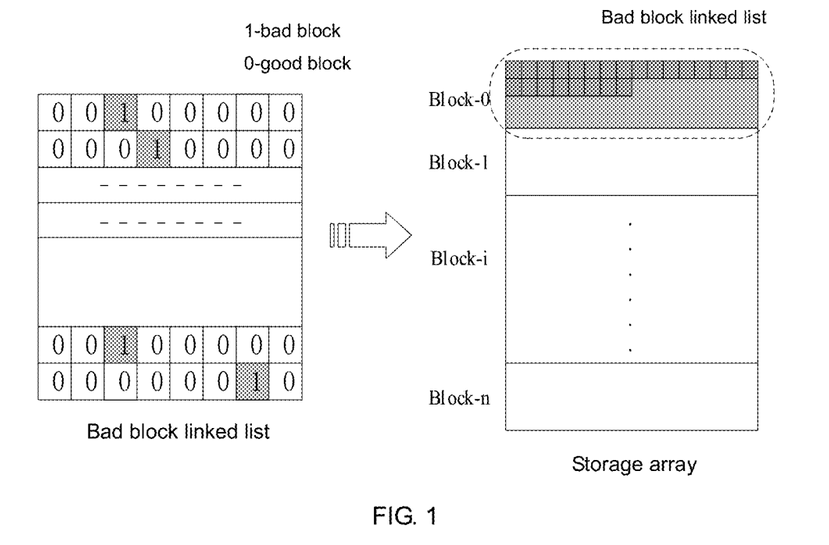
FIG. 1 is a diagram of a storage array and bad block information in a Nand device according to an embodiment of the present invention.

The bad block information provided by the embodiment of the present invention and the scheme of performing data read/write operations based on bad block information are described below. The bad block information includes a bad block set in the Nand device. Specifically, the bad block information may be a bad block linked list in the practical applications. As shown in FIG. 1, in the bad block linked list, bits are used to indicate whether the block is a good block or a bad block, that is, one bit represents a good or bad condition of one block; for instance, when the block is a bad block, the corresponding bit of the block is set to "1"; when the block is a good block, the corresponding bit of the block is set to "0". Then, the set of all bad blocks whose bits are set to "1" is the bad block set. It is to be understood that the above examples are merely illustrative and should not be construed as being specifically limited.

In a specific embodiment of the present invention, a block in the storage array may be used to store the bad block information, for instance, block_0 in the storage array is used to store the bad block linked list.

Figure 2:
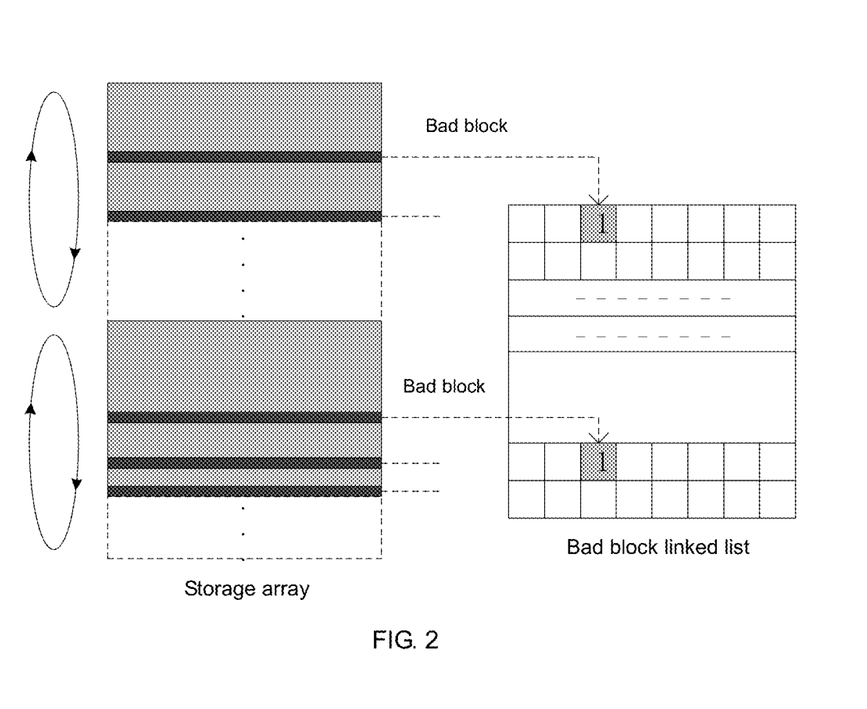
FIG. 2 is a diagram of a storage array and bad block information in another Nand device according to an embodiment of the present invention.

In the specific embodiment of the present invention, when a data read/write operation is required for some blocks, the hardware controller first queries the bad block set in the bad block information, and skips the bad blocks belonging to the bad block set among the blocks. Further, the read/write operations are performed on other blocks in these blocks (it can be understood that the other blocks are good blocks). Furthermore, as shown in FIG. 2, for a storage application of different data types, the storage space of the Nand device may be divided into a plurality of storage areas, and each storage area includes a preset number of blocks. Each storage area can be separately simulated into a circular queue mode to avoid the occurrence of bad blocks caused by repeated write operations on the same block. In particular, for batch data that needs to be updated in real time, two circular queues can be allocated for read and write, one circular queue is responsible for the current read, and one circular queue is responsible for real-time update write; when it is determined that the real-time update write is completed, the flag byte can be set, the read and write circular queues are switched, the original read circular queue becomes the real-time update queue, and the original real-time update queue becomes the read circular queue; and the set flag byte can be updated to a non-volatile memory.

Figure 3:
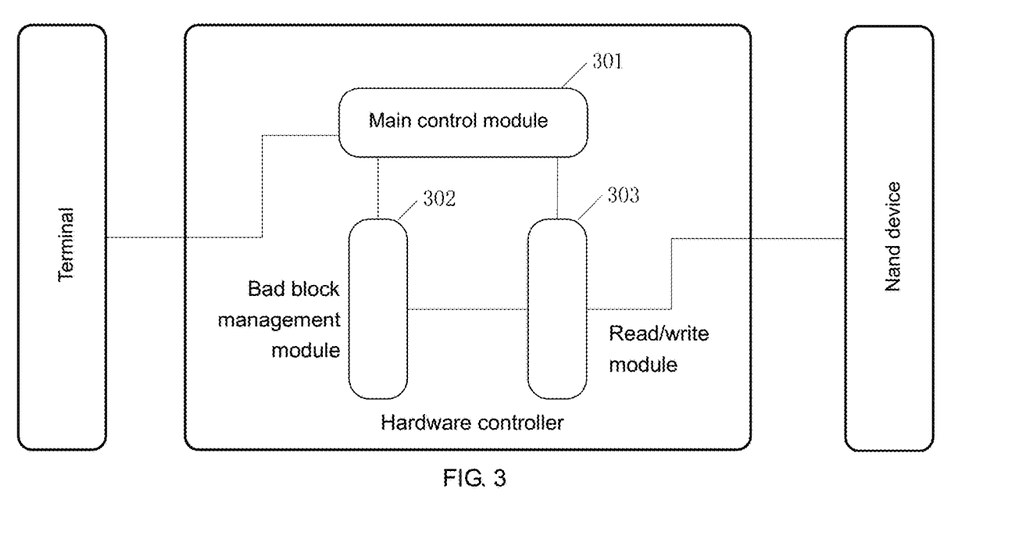
FIG. 3 is a diagram of a system architecture provided by an embodiment of the present invention.

In order to solve the defects of the prior art for bad block management, the embodiment of the present invention further provides a system architecture. Please refer to FIG. 3. FIG. 3 is a diagram of a system architecture provided by an embodiment of the present invention. The system architecture includes a user side terminal (Host), a hardware controller and a Nand device, wherein the hardware controller is respectively connected to the user side terminal (Host) and the Nand device. The user side terminal (Host) is used to generate read/write operation commands, which may be peripheral devices, such as a computer host, a mobile phone, a tablet computer or an internet of thing device, and further may be a processor, such as a central processing unit, a graphics processor, a neural network processor, etc. In the embodiment of the present invention, the Nand device (for instance, Nand flash, etc.) is a non-volatile storage device, which has the advantages of lower power consumption, lighter weight and better performance, and possesses advantages of a larger capacity and a faster rewrite speed, and thus can be used for the storage of large amounts of data. The hardware controller is configured to operate the Nand device according to an operation instruction of the user side terminal (Host). In the embodiment of the present invention, the hardware controller may be packaged together with the Nand device as the same device, and the hardware controller may be independent of the Nand device, which is not specifically limited herein.

Specifically, the hardware controller in the embodiment of the present invention may include the following structures: a main control module 301, a bad block management module 302 and a read/write module 303. wherein, the main control module is configured to connected with a user side terminal to receive an operation command of a terminal; wherein the operation command is used to indicate a read/write operation on a target block set of the Nand device and a data transmission mode used to perform the read/write operation, and the data transmission mode includes at least one of parallel transmission and serial transmission; and in the embodiment of the present invention, after the hardware controller establishes connections with the terminal at the user side and the Nand device, the hardware controller receives an operation command issued by the terminal based on the data transmission mode supported by the Nand device, and the operation command instructs the hardware controller to adopt at least one of parallel transmission and serial transmission to perform the read/write operation on the target block set of the Nand device.

The bad block management module 302 is configured to manage bad block information of the Nand device, where the bad block information represents a bad block set in the Nand device; for details, refer to the description of the bad block information in the embodiment of FIG. 1 above, and details are not described herein again.

The read/write module 303 is configured to connect with the Nand device to skip a block in the Nand device that exists in the bad block set and the target block set at the same time, and to perform the read/write operation on remaining blocks in the target block set.

In the embodiment of the present invention, when the terminal issues a command to perform a read/write operation on the Nand device, the hardware controller first queries the bad block set in the bad block information, and skips the bad block included in the bad block set, and then performs read/write operations on other good blocks.

By implementing the embodiment of the present invention, the read/write module performs the read/write operation on the blocks in the target library set in the Nand device except the bad block set based on the data transmission mode determined by the main control module, combined with the bad block information in the bad block management module. Thus, the embodiment of the present invention is applicable not only to the Nand device of different data transmission modes, but also can perform fast read/write operations on the basis of the bad block management of the Nand device without occupying the large running memory of the terminal, thereby improving the applicability of the Nand device.

Figure 4:
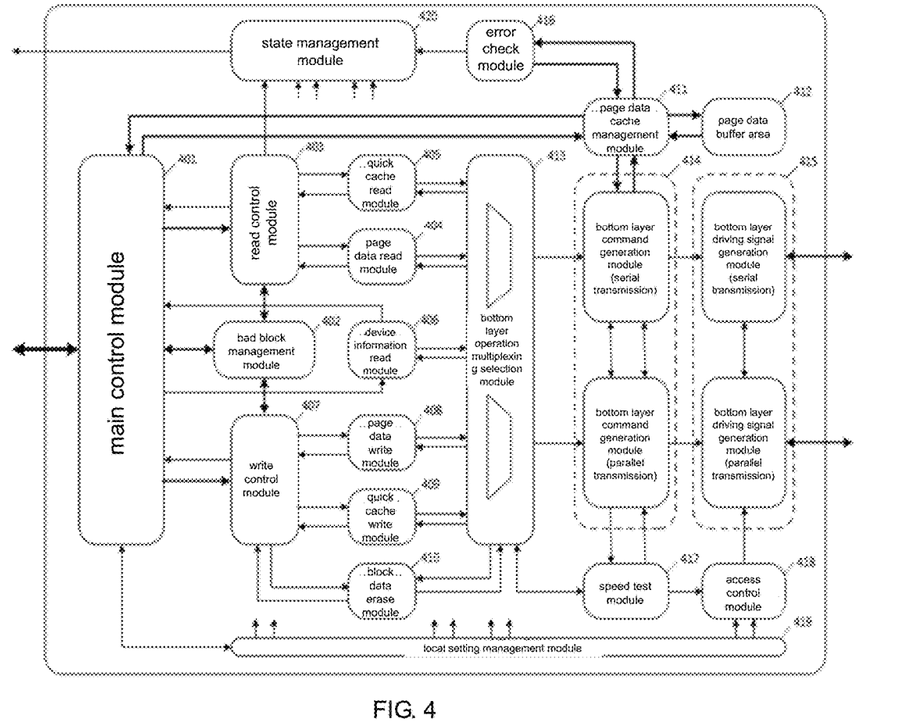
FIG. 4 is a structural diagram of a hardware controller according to an embodiment of the present invention.

Please refer to FIG. 4. FIG. 4 is a structural diagram of another hardware controller according to an embodiment of the present invention. Compared with the previous embodiment of the present invention, the hardware controller provided by this embodiment has a finer structure and more functions. As shown in FIG. 4, the hardware controller in the embodiment of the present invention includes:

a main control module 401, configured to perform communication and data interaction with a user side terminal, and to parse a command issued by the terminal, and to drive the next-layer module to operate;

Besides, the main control module 401 is configured to receive an operation command of a terminal; wherein the operation command is used to indicate a read/write operation on a target block set of the Nand device and a data transmission mode used to perform the read/write operation, and the data transmission mode includes at least one of parallel transmission and serial transmission.

A bad block management module 402 is configured to perform storage management on the bad block information of the Nand device; specifically, to provide bad block information to the corresponding read/write module during the read/write operation.

A read control module 403 is configured to select a corresponding next level module to perform a read operation according to an instruction issued by the main control module 401.

The page data read module 404 is configured to perform a read operation on the page data in the Nand device; specifically, to generate a page data read command to a bottom layer module based on the instruction issued by the read control module 403.

In the embodiment of the present invention, the bottom layer module may include a bottom layer operation multiplexing selection module 413, a bottom layer command generation module 414, and a bottom layer driving signal generation module 415. During the read/write operation, the corresponding serial/parallel bottom layer command generation module 414 is selected by the bottom layer operation multiplexing selection module 413 for instruction transmission.

A quick cache read module 405 is configured to quickly and continuously read a plurality of page data in the Nand device in the case of the parallel transfer mode; specifically, to generate a quick cache read command to the bottom layer module based on the instruction issued by the read control module 403.

A device information read module 406 is configured to read device information of the Nand device; specifically, used to interact with the bottom layer module to read device information under the instruction of the main control module 401.

A write control module 407 is configured to select a corresponding next-level module to perform a write operation according to the command issued by the main control module 401.

A page data write module 408 is configured to perform a write operation on the page data in the Nand device; specifically, to generate a page data write instruction to the bottom layer module based on the instruction issued by the write control module 407.

A quick cache write module 409 is configured to quickly and continuously write a plurality of page data in the Nand device in the case of the parallel transfer mode; specifically, to generate a quick cache write command to the bottom layer module based on the instruction issued by the write control module 407.

A block data erase module 410 is configured to perform an erase operation on the block data in the Nand device; specifically, to generate a block erase command to the bottom layer module based on the instruction issued by the write control module 407.

A page data cache management module 411 is configured to be responsible for the write or read management of the page data to a buffer area 412; specifically, the data of the control terminal or the data of the read operation is written to the buffer area 412, and the read data of the buffer area 412 is controlled to be sent to the terminal or written into the Nand device.

The page data buffer area 412 is used for buffering page data; specifically, the page data buffer may be implemented by a volatile memory such as an SRAM memory. Preferably, the buffer area can implement buffering of two pages, and the write operation or the read operation of the Nand device can use the buffer area in a time division multiplexing manner.

The bottom layer operation multiplexing selection module 413 is configured to select a path of corresponding bottom layer command generation module 414 according to the control command issued by the upper level module.

The bottom layer command generation module 414 is divided into a bottom layer command generation module based on parallel transmission and a bottom layer command generation module based on serial transmission, and is specifically configured to generate a command sequence to the bottom layer driving signal generation module 415 according to the control command issued by the upper level module.

The bottom layer driving signal generation module 415 is divided into a bottom layer driving signal generation module based on parallel transmission and a bottom layer driving signal generation module based on serial transmission, specifically for generating a driving sequence of the Nand device according to the command sequence issued by the bottom layer command generation module 414;

in the embodiment of the present invention, the main control module 401 selects a data transmission mode for performing the read/write operation on the target block set of the Nand device and performing the read/write operation according to the operation command of the terminal. The bottom layer operation multiplexing selection module 413 selects the bottom layer driving module for parallel transmission or serial transmission by the control command issued from the upper level according to the data transmission mode, thereby performing corresponding read/write operations on the Nand device.

The error check module 416 is configured to perform error check and correction on data corresponding to the read operation during the read operation;

in the embodiment of the present invention, the error checking module is specifically configured to perform error check and error correcting code (ECC) on the data by means of hardware. Specifically, when the read operation is performed for the data from the Nand device, the data read in the buffer area 412 can be verified by the error check module to ensure the correctness of the data.

A speed test module 417 is configured to test a maximum access speed of the Nand device; and is specifically used to interact with the underlying module to test the maximum access speed.

An access control module 418 is configured to control the access mode and the access speed of the Nand device, and is specifically used to issue control commands to the bottom layer module, thereby controlling the access mode and access speed of the Nand device.

In the embodiment of the present invention, after the hardware controller establishes a connection with the Nand device and the terminal, the access speed between the hardware controller and the Nand device is a default speed. When the hardware controller does not perform the maximum access speed test on the Nand device, the speed test module 417 starts testing the maximum access speed of the Nand device, and the access control module 418 adjusts the access speed to the maximum access speed when the test passes.

A local setting management module 419 is configured to set configuration parameters of each module in the hardware controller.

A state management module 420 is configured to generate a corresponding work signal according to the working state of each module and to feed back to the user side terminal.

In the embodiment of the present invention, after the hardware controller establishes a connection with the terminal and the Nand device, the main control module 401 in the hardware controller enters an initialization process. After the initialization is completed, the state management module 420 feeds back the initialization completion signal to the terminal, and then waits for the control command of the terminal; when the main control module 401 receives the control command of the terminal, the control command is first parsed, and then the corresponding operation is performed. The main control module 401 sets a busy signal during the entire operation, and the state management module 420 feeds back the busy signal to the terminal, indicating that the control command of the terminal is no longer accepted during this period; after the operation of the main control module 401 is completed, the state management module 420 clears the busy signal and feeds back the current operating state to the terminal while waiting for the next control command of the terminal.

Figure 5:
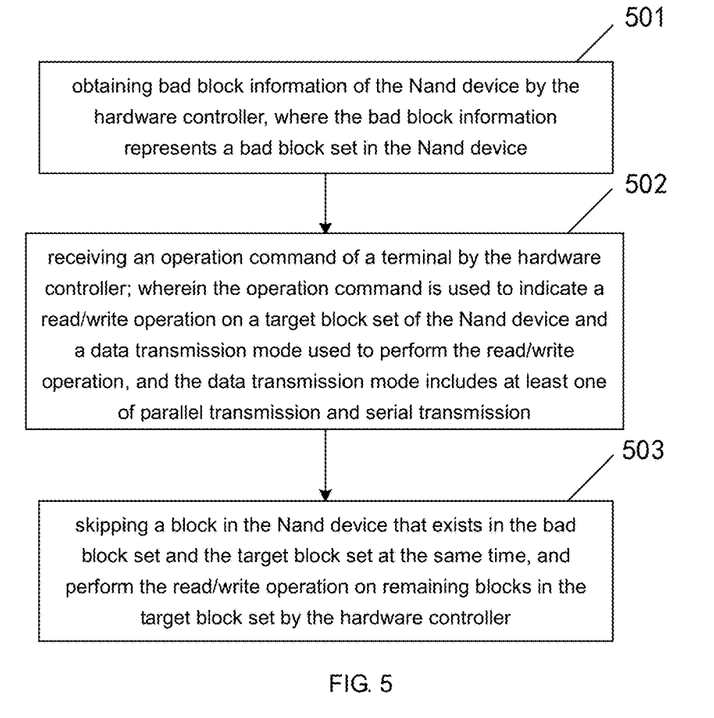
FIG. 5 is a flowchart of a control method according to an embodiment of the present invention.

Based on the same inventive concept, the embodiment of the present invention further provides a control method. Please refer to FIG. 5. FIG. 5 is a flowchart of the control method. This embodiment is mainly illustrated by the hardware controller of the above embodiment. The control method includes but is not limited to the following steps:

Step 501, obtaining bad block information of the Nand device by the hardware controller, where the bad block information represents a bad block set in the Nand device.

For details, refer to the foregoing description of the embodiment of FIG. 1, and details are not described herein again.

Step S502, receiving an operation command of a terminal by the hardware controller; wherein the operation command is used to indicate a read/write operation on a target block set of the Nand device and a data transmission mode used to perform the read/write operation, and the data transmission mode includes at least one of parallel transmission and serial transmission.

Step 503, skipping a block in the Nand device that exists in the bad block set and the target block set at the same time, and perform the read/write operation on remaining blocks in the target block set by the hardware controller.

In one embodiment, the control method further comprises: adding a block corresponding to the write operation as a bad block to the bad block set when data is not successfully written into the block in the write operation; and wherein the write operation includes at least one of an erase operation and a program operation.

In one embodiment, the control method further comprises: performing error check and correction on data corresponding to the read operation during the read operation.

In one embodiment, the control method further comprises: testing a maximum access speed of the Nand device; and performing the read/write operation on the remaining blocks in the target block set according to the maximum access speed.

In one embodiment, the control method further comprises: saving the bad block information of the Nand device, the data transmission mode corresponding to the Nand device and the maximum access speed corresponding to the Nand device to a memory.

It can be seen that this embodiment can support Nand devices with different data access modes. During the operation of the Nand device, it is possible to quickly skip the bad block to perform a corresponding read/write operation on the good block based on the bad block set, thereby making the terminal more suitable for the read/write operation of the Nand device.

The implementation process of the write/read operation involved in the embodiment of the present invention is further described below.

Figure 6:
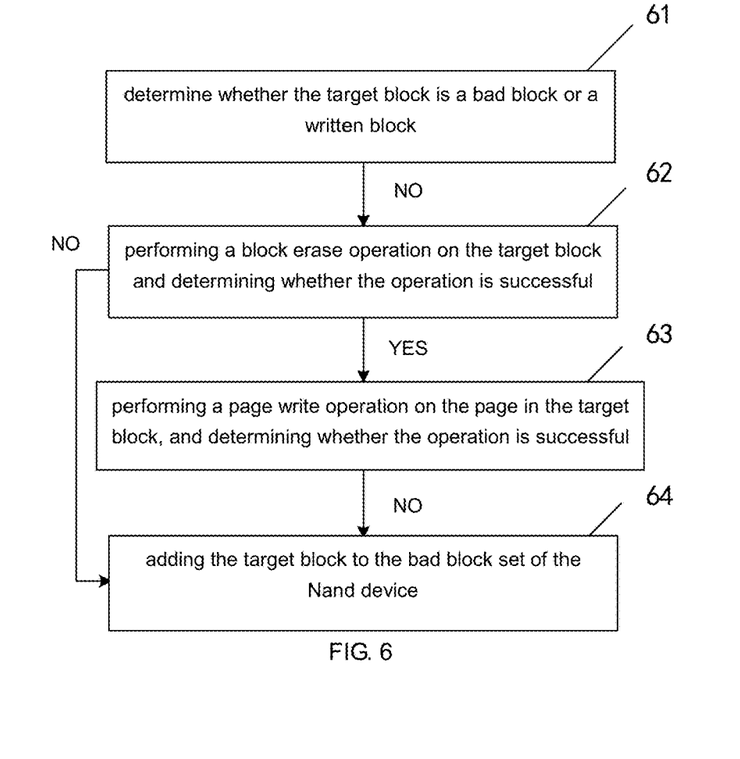
FIG. 6 is a flowchart of a write operation according to an embodiment of the present invention.

In the embodiment of the present invention, the write operation is to write data into the target page in the target block. Please refer to FIG. 6. FIG. 6 is a flowchart of a write operation of the hardware controller, including but not limited to the following steps:

61, determine whether the target block is a bad block or a written block.

Specifically, the hardware controller queries the bad block set of the Nand device in the bad block management module to determine whether the target block is a bad block. When it is detected that the target block is a bad block or a written block, the current target block is skipped, and this step is re-executed taking the next block as the target block until a good block is found.

62, performing a block erase operation on the target block and determining whether the operation is successful.

Specifically, the block erase operation is first performed on the target block, and the block erase operation is to write the data bits in the block to the same data information, for instance, to write the data bit to "1" to facilitate subsequent write operation. Then, it is detected whether the erase operation of the target block is successfully performed, if successful, Step 63 is performed, and if it is not, Step 64 is performed.

63, performing a page write operation on the page in the target block, and determining whether the operation is successful.

In the embodiment of the present invention, according to the write command issued by the terminal, the data is written into the target page of the target block by the write operation. When the hardware controller detects that the page write operation has failed, Step 64 is performed. Specifically, a data write operation is performed on the target page, and it is detected whether the data write operation for the target page is successful. When the hardware controller detects that the data write operation fails, the number of write failures of the target page is increased by 1, and the data write operation is performed on the target page again; if it is detected that the number of write failures of the target page is higher than the preset number of times, the hardware controller determines that the page write operation of the target page fails, and Step 64 is performed. Optionally, the preset number of times is three times.

Specifically, if there is still data to be written after the target page is written, the hardware controller continues the write operation by using the next page as the target page. Similarly, if there is still data to be written after the target block is written, the hardware controller takes the next block as the target block and performs step 61.

64, adding the target block to the bad block set of the Nand device.

In the embodiment of the present invention, the hardware controller may use a volatile memory to store the bad block linked list of the Nand device described in the embodiment shown in FIG. 1. Specifically, the bad block linked list of the Nand device may be stored in the bad block management module described above, and the same bad block linked list may be stored in the non-volatile memory. Specifically, the volatile memory may be an SRAM memory; the non-volatile memory may be a memory in a hardware controller, or may be a memory independent of the hardware controller and the Nand device, or a dedicated storage area (such as the Block-0 area) in the Nand device. Furthermore, when the Nand device generates a bad block due to a block erase operation or a page program operation during operation, not only the bad block is added to the bad block linked list of the bad block management module, but also the bad block linked list is updated to the non-volatile memory.

In the embodiment of the present invention, the read operation is to read related data information from the Nand device, including: a bad block scan operation and a data read operation. The bad block scan operation specifically is: detecting a bad block information byte in each block, and when the bad block information byte indicates that the block is a bad block, adding this block to the bad block set to prevent it from being erased abnormally while the Nand device is running. The bad block information byte is an information byte used to calibrate a bad block before leaving the factory.

Thus, during the write operation of the hardware controller to the Nand device, not only the bad block can be skipped to perform the corresponding write operation, but also the found bad block can be added to the bad block set for subsequent read and write.

Figure 7:
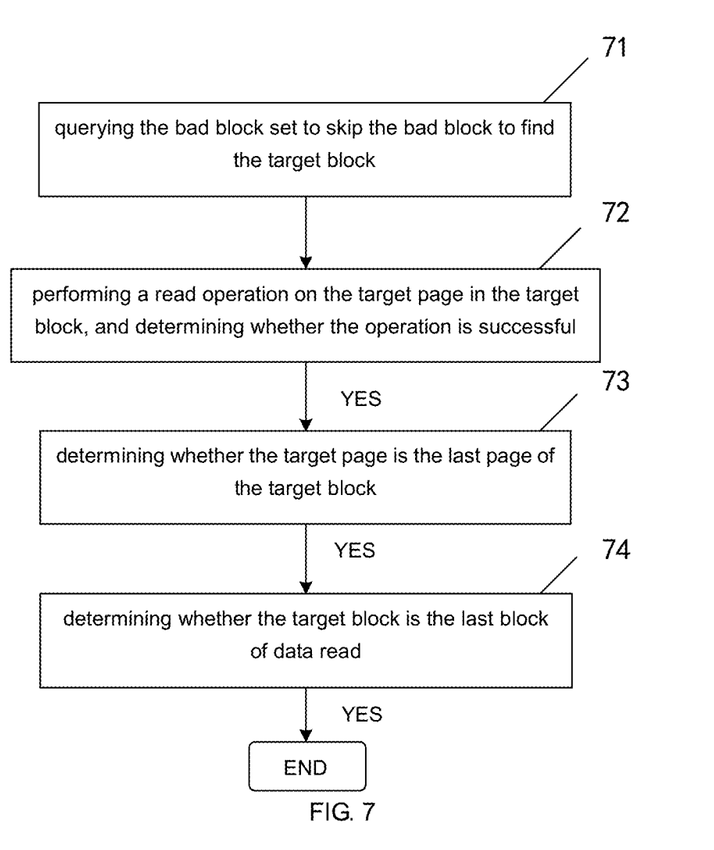
FIG. 7 is a flowchart of a read operation according to an embodiment of the present invention.

In the embodiment of the present invention, the read operation is to read the data of the target page in the target block in the Nand device. Please refer to FIG. 7. FIG. 7 is a flowchart of a read operation of the hardware controller, where the read operation process includes but not limited to the following steps:

71, querying the bad block set to skip the bad block to find the target block;

specifically, the bad block set (bad block linked list) of the Nand device in the bad block management module is queried to determine whether the target block is a bad block. When it is detected that the target block is a bad block, the current target block is skipped, and this step is re-executed taking the next block as the target block until a good block is found.

72, performing a read operation on the target page in the target block, and determining whether the operation is successful;

if the hardware controller detects that the read operation on the target page of the target block is successful, Step 73 is performed; if the hardware controller detects that the read operation on the target page of the target block fails, the read operation is terminated and the read failure is determined.

73, determining whether the target page is the last page of the target block;

if the hardware controller detects that the target page is not the last page of the target block, the next page is taken as the target page and Step 72 is re-executed; if the hardware controller detects that the target page is the last page of the target block, Step 74 is performed.

74, determining whether the target block is the last block of data read;

if the hardware controller detects that the target block is not the last block of the read data, the next block is taken as the target block and Step 71 is re-executed; if the hardware controller detects that the target block is the last block of the read data, the data read is completed.

It can be seen that during the read operation of the Nand device by the hardware controller, the bad block can be skipped to read the target page in the target block, which improves the read efficiency.

Figure 8:
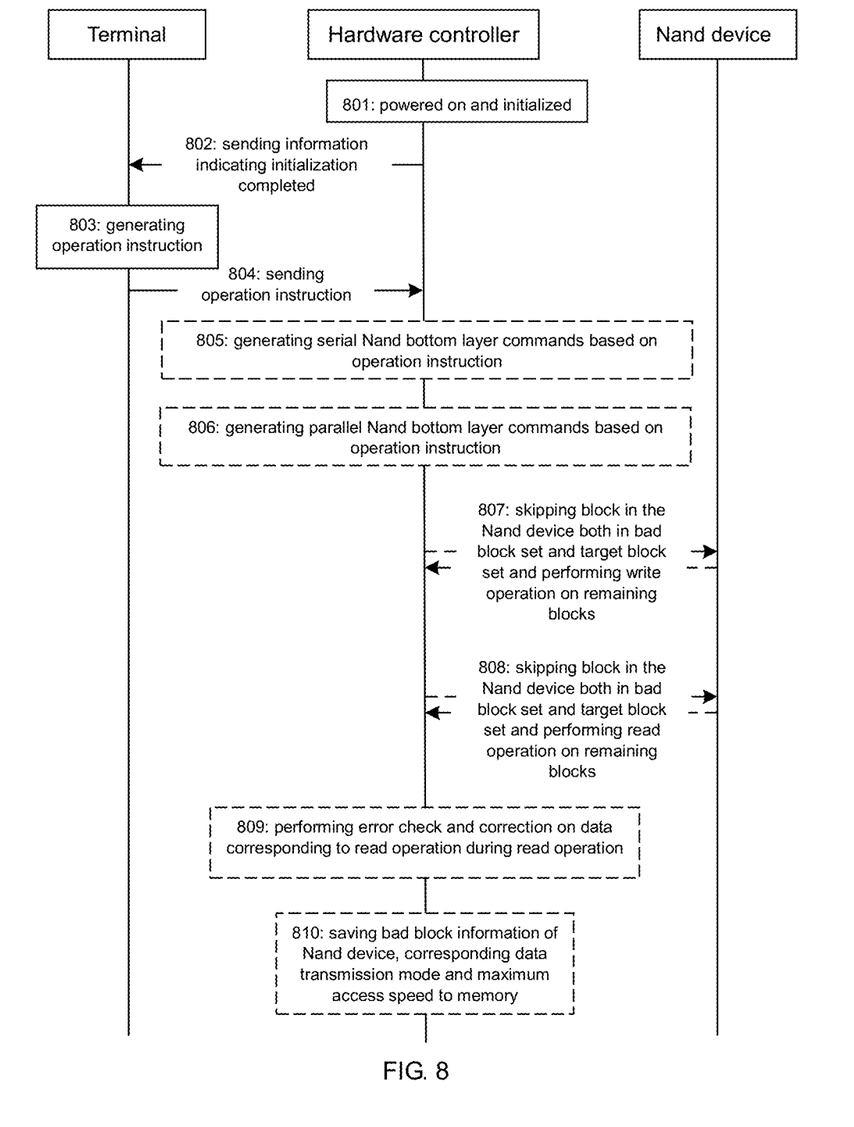
FIG. 8 is a flowchart of another control method according to an embodiment of the present invention.

Based on the same inventive concept, the embodiment of the present invention further provides another control method. Please refer to FIG. 8. FIG. 8 is a flowchart of another control method. This embodiment is mainly illustrated by the hardware controller of the above embodiment. The control method includes but is not limited to the following steps:

Step 801, the hardware controller is powered on and initialized;

In the embodiment of the present invention, when the hardware controller establishes a connection with the terminal and the Nand device, the initialization is started. The initialization is to set each module parameter of the hardware controller to a default state or an adaptation state, thereby providing a subsequent read/write operation for the terminal, and the parameters involved in the initialization include data transmission mode, access speed, extraction of bad block information, and the like.

Figure 9:
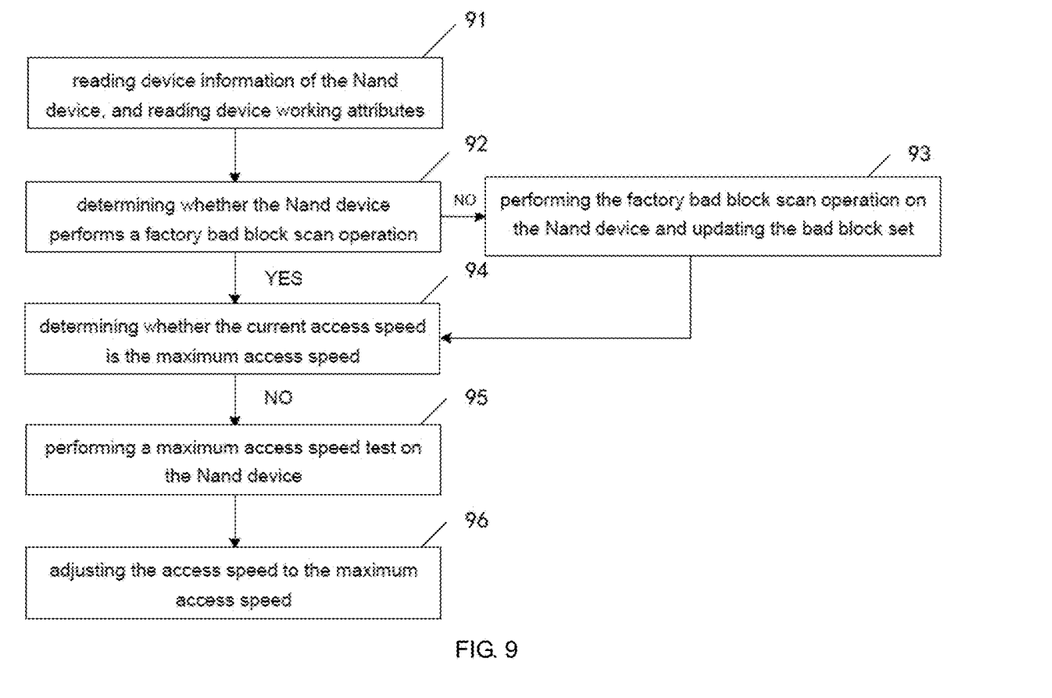
FIG. 9 is a flowchart of initialization according to an embodiment of the present invention.

The initialization process is described in detail below. Please refer to FIG. 9. FIG. 9 is a flowchart of initialization after establishing a connection, including but not limited to the following steps:

91, reading device information of the Nand device, and reading device working attributes;

in the embodiment of the present invention, the device information of the Nand device read by the device information read module is the device ID, so that the maximum access speed, the data transmission mode and factory bad block identifier of the Nand device can be determined. In addition, device working attributes include bad block scan state, bad block information, and the like. Specifically, after the Nand device completes the bad block scan, the hardware controller sets a scan identification byte to indicate that the bad block scan state of the Nand device is the scanned state.

92, determining whether the Nand device performs a factory bad block scan operation;

93, performing the factory bad block scan operation on the Nand device and updating the bad block set;

94, determining whether the current access speed is the maximum access speed;

In the embodiment of the present invention, the current access speed is the default access speed, and the maximum access speed is the access speed obtained by reading the device information. If the hardware controller detects that the current access speed is the maximum access speed, the current access speed is maintained; if the hardware controller detects that the current access speed is not the maximum access speed, Step 95 is performed.

95, performing a maximum access speed test on the Nand device;

specifically, the hardware controller performs a read/write test according to the maximum access speed of the Nand device, and if the test passes, Step 95 is performed; if the test fails, the default access speed is maintained.

96, adjusting the access speed to the maximum access speed.

It should be noted that, after the analysis of the working attributes, such as the bad block information, the data transmission mode, the maximum access speed, the configuration parameters and the bad block scan state is completed or updated, the hardware controller updates and stores the working attribute to a non-volatile state memory, to ensure that the work attributes can be read after the restart to quickly perform the read/write operation.

It can be seen that the initialization process of the hardware controller can obtain the bad block information of the Nand device, and can adjust the access speed to the maximum access speed, thereby facilitating the read/write operation of the Nand device by the hardware controller based on the terminal command.

Step 802, the hardware controller sends information indicating that the initialization is completed to the user side terminal;

specifically, after the hardware controller establishes a connection with the terminal and the Nand device, the main control module in the hardware controller enters an initialization process. After the initialization is completed, the state management module feeds back the initialization completion signal to the terminal, and then waits for the control command of the terminal; when the main control module receives the control command of the terminal, the control command is first parsed, and then the corresponding operation is performed. The main control module sets a busy signal during the entire operation, and the state management module feeds back the busy signal to the terminal, indicating that the control command of the terminal is no longer accepted during this period; after the operation of the main control module is completed, the state management module clears the busy signal and feeds back the current operating state to the terminal while waiting for the next control command of the terminal.

Step 803, the user side terminal (Host) generates an operation instruction;

specifically, the operation instruction may be a read/write command to the Nand device generated by the user's operation, or may be a read/write command to the Nand device automatically generated when the program of the host is running, which is not limited herein.

Optionally, Table 1 is an example of a command code set agreed by the hardware controller and the host. The master hardware controller in the hardware controller may respond to the command code set and perform a specific operation; the command code set can be flexibly extended or added with more control commands.

TABLE 1

| command code | command operation |
|---|---|
| 0001 | Update bad block linked list |
| 0010 | Forced initialization |
| 0011 | write operation 1 |
| 0100 | write operation 2 |
| ... | ... |
| 0111 | write operation n |
| 1000 | forced bad block scan |
| 1001 | read device information |
| 1010 | read operation 1 |
| 1011 | read operation 2 |
| ... | ... |
| 1111 | read operation n |

Step 804: the user side terminal sends an operation instruction to the hardware controller;

specifically, the operation command is used to indicate a read/write operation on a target block set of the Nand device and a data transmission mode used to perform the read/write operation, and the data transmission mode includes at least one of parallel transmission and serial transmission.

Step 805, optionally, when the operation instruction indicates that the data transmission mode used for performing the read/write operation is serial transmission, the hardware controller generates a serial Nand bottom layer commands based on the operation instruction.

Specifically, when the control instruction indicates that the data transmission mode used for performing the read/write operation is serial transmission, the hardware controller generates a serial Nand bottom layer command. For example, for a certain page programming operation of a block, there are processes, such as write enable, write load, write execution and acquire features, and each process is decomposed into single or multiple operation cycles to complete each operation. Each operation cycle consists of 8 operating times.

Step 806, optionally, when the operation instruction indicates that the data transmission mode used for performing the read/write operation is parallel transmission, the hardware controller generates a parallel Nand bottom layer command based on the operation instruction.

Specifically, when the operation instruction indicates that the data transmission mode used for performing the read/write operation is parallel transmission, the hardware controller generates a Parallel Nand bottom layer command. For example, the bottom layer operations include write load, address send, write confirmation, read state, read state registration, and the like. In addition, parallel Nand devices generally use asynchronous interface timing, which has special address, command and read/write control signals. in this application, each operation process is decomposed into single or multiple sub-operations, and sub-operations respectively correspond to addresses and commands, read/write data, etc.

Step 807, optionally, when the operation instruction indicates to perform a write operation on the Nand device, the hardware controller skips the block in the Nand device that exists in the bad block set and the target block set at the same time, and perform the write operation on remaining blocks in the target block set.

For details, refer to related descriptions in the foregoing embodiments in FIG. 6, and details are not described herein again.

Step 808, optionally, when the operation instruction indicates to perform a read operation on the Nand device, the hardware controller skips the block in the Nand device that exists in the bad block set and the target block set at the same time, and perform the read operation on remaining blocks in the target block set.

For details, refer to related descriptions in the foregoing embodiments in FIG. 7, and details are not described herein again.

Specifically, Step 807 and Step 808 may be or related, that is, only the write operation or the read operation is performed in one time; Step 807 and Step 808 may also be and related, that is, the control command issued by the terminal instructs the hardware controller to simultaneously perform a write operation and a read operation on the Nand device.

Step 809, optionally, performing error check and correction on data corresponding to the read operation during the read operation.

Step 810, optionally, saving the bad block information of the Nand device, the data transmission mode corresponding to the Nand device and the maximum access speed corresponding to the Nand device to a memory.

Specifically, after the hardware controller determines parameters such as bad block information, data transmission mode and maximum access speed in the Nand device, the parameters may be stored in the memory to prevent data loss after power failure. In a specific embodiment, the memory may be a memory in a hardware controller, or may be a memory independent of the hardware controller and the Nand device, or a dedicated storage area (such as the Block-0 area) in the Nand device.

Through the control method provided by the embodiment of the present invention, the hardware controller tests the maximum access speed for transmission during the initialization process, and can skip the bad block during the read/write operation, and can perform error check and error correction on the data. It can be seen that the embodiment of the present invention can maximize the user experience, help the terminal to quickly read/write data, and reduce the running memory occupied by the terminal.

Based on the hardware controller described above with reference to FIG. 4, the process of executing the control method of the embodiment of the present invention by the relevant module in the hardware controller is specifically described below.

Figure 10:
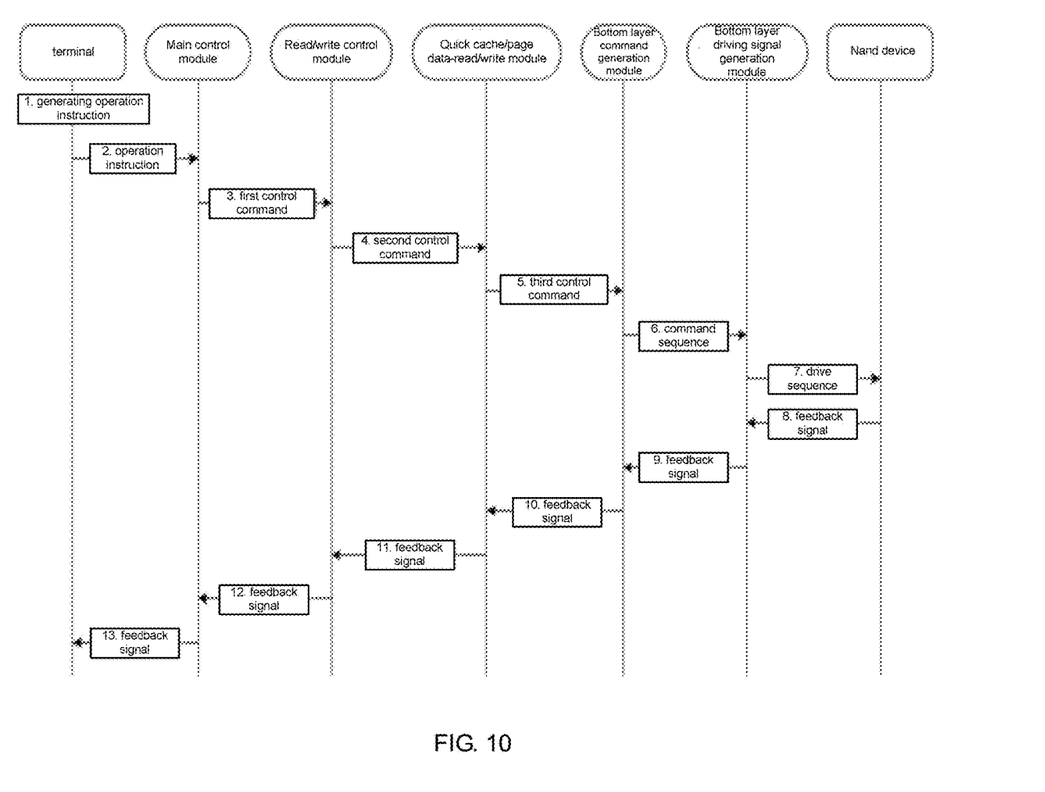
FIG. 10 is a diagram of interaction of a layered module according to an embodiment of the present invention.

In the embodiment of the present invention, each module of the hardware controller adopts a hierarchical design for internal command transmission and corresponding process operations. FIG. 10 is a diagram showing a process in which a hardware controller cooperates with a terminal to perform an operation process, and the detailed description is as follows:

1, the terminal generates an operation instruction;

2, the terminal transmits the operation instruction to the main control module of the hardware controller;

3, the main control module of the hardware controller generates a first control command based on the operation instruction and transmits the corresponding control command to the corresponding read/write control module;

4, the read/write control module of the hardware controller generates a second control command based on the first control command and transmits to the corresponding quick cache/page data-read/write module;

5, the quick cache/page data-read/write module of the hardware controller generates a third control command based on the second control command and transmits to the corresponding serial/parallel bottom layer command generation module;

6, the serial/parallel bottom layer command generation module of the hardware controller generates a command sequence based on the third control command and transmits the command sequence to the corresponding serial/parallel bottom layer driving signal generation module;

7, the serial/parallel bottom layer driving signal generation module of the hardware controller generates a drive sequence based on the command sequence and transmits the drive sequence to the Nand device;

8-13, the Nand device and the respective layer modules of the hardware controller feedback operation completion signals to the upper levels in order.

It can be seen that after the terminal initiates the control operation, the hardware controller controls each layer module to perform operations through internal control commands, and each layer module sequentially responds to the operation request of the upper layer module from top to bottom; correspondingly, after the operation of the bottom layer module completed, each layer module feeds back to the upper layer of the module about the completion of the operation from bottom to top. After receiving the signal of the next layer about the completion of the operation, the main control module feeds back the operation result to the terminal and waits for the next operation.

Based on the same inventive concept, the present invention further provides a liquid crystal display comprising the hardware controller provided in the foregoing embodiments. The liquid crystal display can also perform the control method provided in the foregoing embodiments. For details, refer to related descriptions in the foregoing embodiments, and details are not described herein again.

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

In the description of the present invention, it should be noted that the terms "installation", "connected", "connection", and "received" are to be understood broadly, and may be mechanical or electrical. For instance, unless otherwise specified and defined, it can also be the internal communication between the two components, which can be directly connected or indirectly connected through an intermediate medium. For those skilled in the art, the specific meanings of the above terms can be understood according to specific situations.

Reference in this specification to "embodiment" means that a particular feature, structure, or characteristic described in connection with the embodiment is included in at least one embodiment of the present invention. Appearances of the phrase "embodiment" in various places in the specification do not necessarily refer to the same embodiment, nor are separate or alternative embodiments mutually exclusive of other embodiments. Those skilled in the art implicitly and explicitly understand that the embodiments described herein may be combined with other embodiments.

It is understandable in practical to the person who is skilled in the art that all or portion of the processes in the method according to the aforesaid embodiment can be accomplished with the computer program to instruct the related hardwares. The program can be stored in a readable storage medium if the computer. As the program is executed, the processes of the embodiments in the aforesaid respective methods can be included. The storage medium can be a hardisk, an optical disc, a Read-Only Memory (ROM) or a Random Access Memory (RAM).

Above are embodiments of the present invention, which does not limit the scope of the present invention. Any modifications, equivalent replacements or improvements within the spirit and principles of the embodiment described above should be covered by the protected scope of the invention.

What is claimed is:

1. A hardware controller of a Nand device, comprising:
a bad block management module, configured to manage bad block information of the Nand device, where a storage space of the Nand device is divided into a plurality of storage areas and each of storage areas includes a preset number of blocks, and the bad block information represents a bad block set in the Nand device;
a main control module, configured to receive an operation command of a terminal; wherein the operation command is used to indicate a read/write operation on a target block set of the Nand device and a data transmission mode used to perform the read/write operation, and the data transmission mode includes at least one of parallel transmission and serial transmission; and
a read/write module, configured to skip a block in the Nand device that exists in the bad block set and the target block set at the same time, and perform the read/write operation on remaining blocks in the target block set, wherein a circular queue is simulated for each of the storage areas, and as performing the read/write operation for batch data, two circular queues are allocated, and one of the two circular queues is responsible for the read operation and the other of the two circular queues is responsible for the write operation, and the two circular queues are able to be simultaneously performed on the Nand device.

2. The hardware controller of the Nand device according to claim 1, wherein the write operation includes at least one of an erase operation and a program operation; the bad block management module is further configured to add a block corresponding to the write operation as a bad block to the bad block set when data is not successfully written into the block in the write operation.

3. The hardware controller of the Nand device according to claim 1, further comprising an error check module, wherein the error check module is configured to perform error check and correction on data corresponding to the read operation during the read operation.

4. The hardware controller of the Nand device according to claim 1, further comprising a speed test module, wherein the speed test module is configured to test a maximum access speed of the Nand device; and the read/write module is specifically configured to perform the read/write operation on the remaining blocks in the target block set according to the maximum access speed.

5. The hardware controller of the Nand device according to claim 4, further comprising a power down protection module, wherein the power down protection module is configured to save the bad block information of the Nand device, the data transmission mode corresponding to the Nand device and the maximum access speed corresponding to the Nand device to a memory.

6. A control method of a Nand device, comprising:
obtaining bad block information of the Nand device, where a storage space of the Nand device is divided into a plurality of storage areas and each of storage areas includes a preset number of blocks, and the bad block information represents a bad block set in the Nand device;
receiving an operation command of a terminal; wherein the operation command is used to indicate a read/write operation on a target block set of the Nand device and a data transmission mode used to perform the read/write operation, and the data transmission mode includes at least one of parallel transmission and serial transmission; and
skipping a block in the Nand device that exists in the bad block set and the target block set at the same time, and perform the read/write operation on remaining blocks in the target block set, wherein a circular queue is simulated for each of the storage areas, and as performing the read/write operation for batch data, two circular queues are allocated, and one of the two circular queues is responsible for the read operation and the other of the two circular queues is responsible for the write operation, and the two circular queues are able to be simultaneously performed on the Nand device.

7. The control method of the Nand device according to claim 6, further comprising: adding a block corresponding to the write operation as a bad block to the bad block set when data is not successfully written into the block in the write operation; and wherein the write operation includes at least one of an erase operation and a program operation.

8. The control method of the Nand device according to claim 6, further comprising: performing error check and correction on data corresponding to the read operation during the read operation.

9. The control method of the Nand device according to claim 6, further comprising: testing a maximum access speed of the Nand device; and performing the read/write operation on the remaining blocks in the target block set according to the maximum access speed.

10. The control method of the Nand device according to claim 6, further comprising: saving the bad block information of the Nand device, the data transmission mode corresponding to the Nand device and the maximum access speed corresponding to the Nand device to a memory.

11. A liquid crystal display, comprising a hardware controller of a Nand device, wherein the hardware controller of the Nand device comprises:
a bad block management module, configured to manage bad block information of the Nand device, where a storage space of the Nand device is divided into a plurality of storage areas and each of storage areas includes a preset number of blocks, and the bad block information represents a bad block set in the Nand device;
a main control module, configured to receive an operation command of a terminal; wherein the operation command is used to indicate a read/write operation on a target block set of the Nand device and a data transmission mode used to perform the read/write operation, and the data transmission mode includes at least one of parallel transmission and serial transmission; and
a read/write module, configured to skip a block in the Nand device that exists in the bad block set and the target block set at the same time, and perform the read/write operation on remaining blocks in the target block set, wherein a circular queue is simulated for each of the storage areas, and as performing the read/write operation for batch data, two circular queues are allocated, and one of the two circular queues is responsible for the read operation and the other of the two circular queues is responsible for the write operation, and the two circular queues are able to be simultaneously performed on the Nand device.

12. The liquid crystal display according to claim 11, wherein the write operation includes at least one of an erase operation and a program operation; the bad block management module is further configured to add a block corresponding to the write operation as a bad block to the bad block set when data is not successfully written into the block in the write operation.

13. The liquid crystal display according to claim 11, wherein the hardware controller further comprises an error check module, and the error check module is configured to perform error check and correction on data corresponding to the read operation during the read operation.

14. The liquid crystal display according to claim 11, wherein the hardware controller further comprises a speed test module, and the speed test module is configured to test a maximum access speed of the Nand device; and
the read/write module is specifically configured to perform the read/write operation on the remaining blocks in the target block set according to the maximum access speed.

15. The liquid crystal display according to claim 14, wherein the hardware controller further comprises a power down protection module, wherein the power down protection module is configured to save the bad block information of the Nand device, the data transmission mode corresponding to the Nand device and the maximum access speed corresponding to the Nand device to a memory.

* * * * *